United States Patent
Bonen

(10) Patent No.: US 10,599,201 B1
(45) Date of Patent: Mar. 24, 2020

(54) DETECTING IMMINENT FAILURE IN A POWER SUPPLY

(71) Applicant: Harmonic, Inc., San Jose, CA (US)

(72) Inventor: Adi Bonen, Belle Mead, NJ (US)

(73) Assignee: Harmonic, Inc., San Jose, CA (US)

(*) Notice: Subject to any disclaimer, the term of this patent is extended or adjusted under 35 U.S.C. 154(b) by 211 days.

(21) Appl. No.: 15/846,989

(22) Filed: Dec. 19, 2017

Related U.S. Application Data

(60) Provisional application No. 62/436,381, filed on Dec. 19, 2016.

(51) Int. Cl.
| G06F 11/00 | (2006.01) |
| G06F 1/30 | (2006.01) |
| G06F 11/07 | (2006.01) |

(52) U.S. Cl.
CPC .............. *G06F 1/30* (2013.01); *G06F 11/076* (2013.01); *G06F 11/0721* (2013.01)

(58) Field of Classification Search
CPC ... G06F 1/30; G06F 1/28; G06F 1/206; G06F 11/0721; G06F 11/076; G06F 11/004; G06F 11/008; G06F 11/0703; G06F 11/0751; G06F 11/0754
USPC .................................................. 714/14, 47.1
See application file for complete search history.

(56) References Cited

U.S. PATENT DOCUMENTS

| 8,411,693 B2* | 4/2013 | Choi .................... H04W 88/08 370/401 |
| 10,139,845 B2* | 11/2018 | Dzuban .................... G05F 1/66 |
| 2016/0300148 A1* | 10/2016 | Kelly .................... G06N 5/048 |

OTHER PUBLICATIONS

Kurschl, Werner, and Wolfgang Beer. "Combining cloud computing and wireless sensor networks." In Proceedings of the 11th International Conference on Information Integration and Web-based Applications & Services, pp. 512-518. ACM, 2009. (Year: 2009).*

Liu, Liangmei, Yong Guan, Minhua Wu, and Lifeng Wu. "Failure prediction of electrolytic capacitors in switching-mode power converters." in Proceedings of the IEEE 2012 Prognostics and System Health Management Conference (PHM—2012 Beijing), pp. 15. IEEE, 2012. (Year: 2012).*

Ma, Hao, and Linguo Wang. "Fault diagnosis and failure prediction of aluminum electrolytic capacitors in power electronic converters." in 31st Annual Conference of IEEE Industrial Electronics Society, 2005. IECON 2005., pp. 6-pp. IEEE, 2005. (Year: 2005).*

(Continued)

*Primary Examiner* — Anthony J Amoroso
(74) *Attorney, Agent, or Firm* — Brokaw Patent Law PC; Christopher J. Brokaw

(57) ABSTRACT

Detecting an imminent failure of a power supply. An internal computerized component periodically reads a set of measurements from one or more sensors affixed to a power supply. The internal computerized component and power supply may reside in a variety of different technical contexts, such as a Remote PHY node. The internal computerized component analyzes the set of measurements using, at least in part, a weighted set of factors, to detect the imminent failure in the power supply. The weighted set of factors may be updated or revised over time and may be specifically tailored for use with specific types of power supplies.

25 Claims, 4 Drawing Sheets

(56) References Cited

OTHER PUBLICATIONS

Kulkarni, Chetan, Gautam Biswas, Xenofon Koutsoukos, Jose Celaya, and Kai Goebel. "Integrated diagnostic/prognostic experimental setup for capacitor degradation and health monitoring." In 2010 IEEE AUTOTESTCON, pp. 1-7. IEEE, 2010. (Year: 2010).*

Lahyani, Amine, Pascal Venet, Guy Grellet, and P-J. Viverge. "Failure prediction of electrolytic capacitors during operation of a switchmode power supply." IEEE Transactions on power electronics 13, No. 6 (1998): 1199-1207. (Year: 1998).*

Imam, Afroz M., Deepak M. Divan, Ronald G. Harley, and Thomas G. Habetler. "Real-time condition monitoring of the electrolytic capacitors for power electronics applications." In APEC 07—Twenty-Second Annual IEEE Applied Power Electronics Conference and Exposition, pp. 1057-1061. IEEE, 2007. (Year: 2007).*

\* cited by examiner

DETECTING IMMINENT FAILURE IN A POWER SUPPLY

CLAIM OF PRIORITY AND RELATED APPLICATION DATA

This application claims priority to U.S. Provisional Patent Application Ser. No. 62/436,381, filed Dec. 19, 2016, entitled "CableOS Smart Node ('Ripple')," the contents of which are hereby incorporated by reference for all purposes as if fully set forth herein.

This application is related to U.S. Non-provisional patent application Ser. No. 15/846,926, entitled, "Estimating a Lifespan of a Power Supply," invented by Adi Bonen, filed on Dec. 19, 2017, the entire disclosure of which is hereby incorporated by reference for all purposes as if fully set forth herein.

FIELD OF THE INVENTION

Embodiments of the invention relate to detecting an imminent failure in a power supply.

BACKGROUND

A Converged Cable Access Platform (CCAP) is an industry standard platform for transmitting video data and voice content. The CCAP is led by CableLabs of Sunnyvale, Calif. CCAP unifies the Converged Multiservice Access Platform (CMAP), managed by Comcast Corporation of Philadelphia, Pa., with the Converged Edge Services Access Router platform (CESAR), which is managed by Time Warner Cable, Inc of New York, N.Y.

CableLabs has publicly issued a Remote PHY family of specifications, known as the MHAv2 specifications (Modular Headend Architecture version 2). These specifications describe how a CCAP platform may be separated into two components, (1) a CCAP Core located at a cable headend, and (2) a Remote PHY device (RPD), which is typically located outdoors. A RPD may be located, for example, at the junction of the fiber and coax plants in an optical node serving as a Remote PHY Node (RPN). A CCAP core can control and setup data paths with multiple RPDs situated in multiple fiber nodes. FIG. 1 is a block diagram of a CCAP platform which includes an RPD situated inside an RPN in accordance with the MHAv2 specifications of the prior art.

CableLabs has also issued a technical report about the R-MACPHY architecture and is currently undertaking an effort to formalize a specification for R-MACPHY products, specifically a Remote MACPHY Device (RMD) which resides in a Remote MACPHY node (RMN). This technical report describes Remote MACPHY (or MAC-PHY) as a generic term given to the distributed CMTS/CCAP architecture where the DOCSIS MAC and PHY layer processing of a CMTS are moved from the headend down to a Fiber Node location.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for detecting an imminent failure in a power supply are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Embodiments of the invention may be used to detect the imminent failure of a power supply. While embodiments of the invention may be used upon a wide variety of power supplies in many different contexts, the approaches discussed herein have particular utility in contexts where the power supply is powering an electronic device coupled to a network. The approaches discussed herein may be used with power supply in many different contexts, such as without limitation, a power area deployed in a remote area, a power supply in a CATV plant, a power supply in an optical node, a power supply in a smart optical node, and a power supply supplying power to a computerized device. For purposes of providing a concrete example, certain embodiments of the invention will be discussed with reference to implementing the invention within a Remote PHY node; however, embodiments of the invention may be employed with power supplies in other contexts and environments. For example, certain embodiments may be employed at a Remote MAC-PHY node (RMN). As another example, other embodiments may be employed at Optical Line Terminal (OLT) node or a 802.11n Wi-Fi Access Point.

Figure 1:
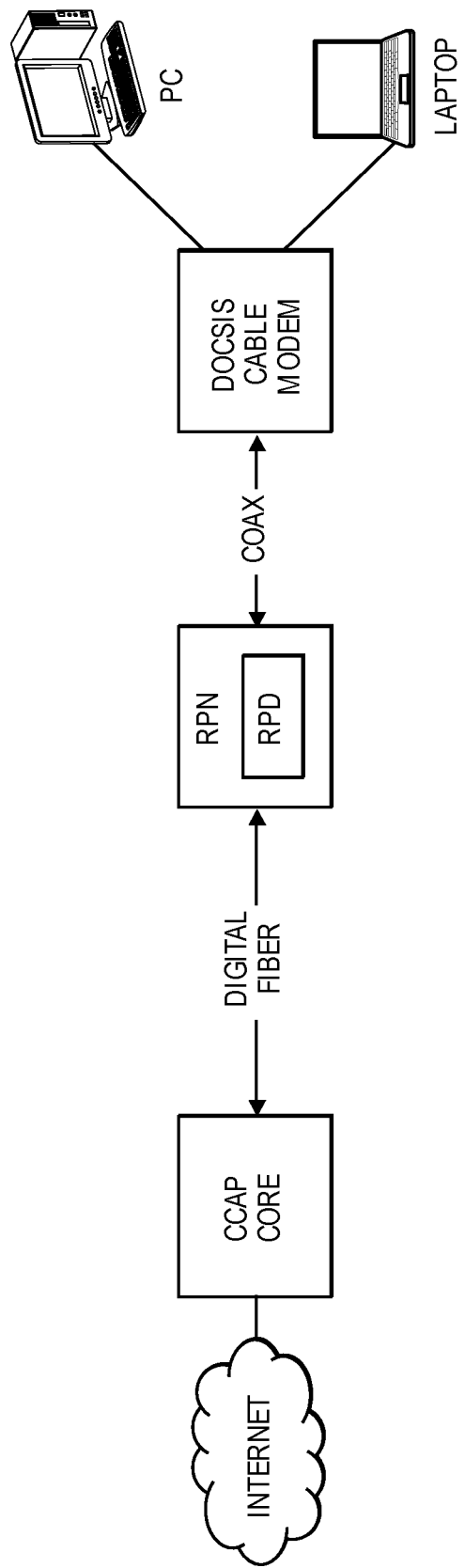
FIG. 1 is a block diagram of a CCAP platform which includes a Remote PHY device (RPD) in accordance with the MHAv2 specifications of the prior art.
Figure 2:
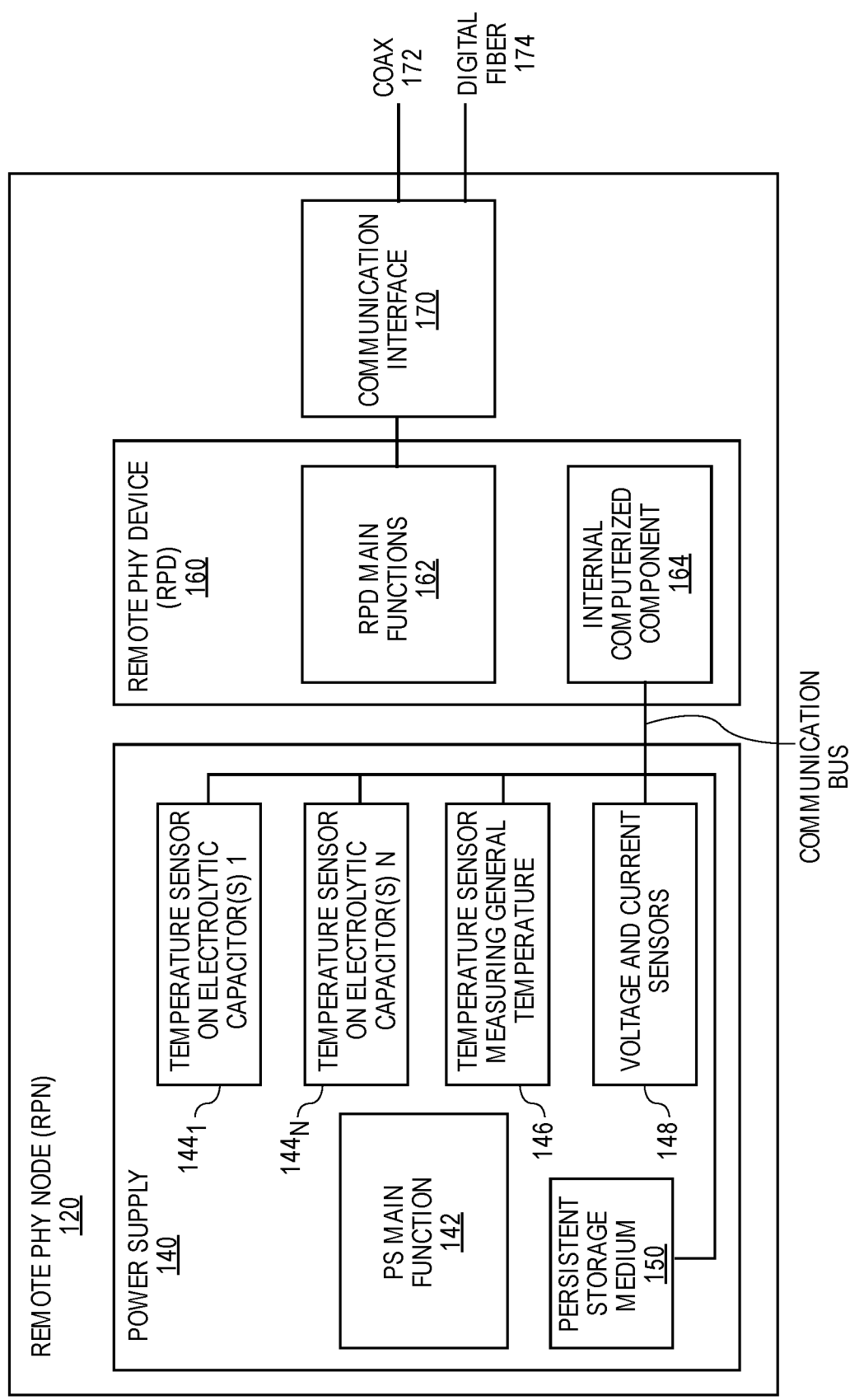
FIG. 2 is a block diagram of a Remote PHY node (RPN) which includes a power supply and a Remote PHY device (RPD) according to an embodiment of the invention.

FIG. 2 is a block diagram of a Remote PHY node (RPN) 120 according to an embodiment of the invention. The function of RPN 120 is to convert downstream DOCSIS data, MPEG video, and out-of-band (OOB) signals from digital to analog one way and transmit them over a plurality of coaxial cables 172 leading to cable subscribers' homes, and receive upstream data, video, and OOB signals from coaxial cables 172 in analog format and convert them to digital the other way. The digital signals are exchanged between the CCAP Core and the RPD, comprised within the RPN, typically over digital fiber 174. RPN 120 may send and receive data over communication links, such as coaxial cables 172 and/or digital fiber 174, using communication interface 170.

Remote PHY nodes, such as RPN 120, are designed to be deployed outdoors near the physical area to be serviced by RPN 120. A non-limiting, illustrative example of RPN 120 includes Harmonic, Inc.'s CableOS™ Ripple-1 Remote PHY node.

RPN 120 is composed of an outer housing that surrounds at least one power supply 140 and at least one Remote Device (RPD) 160. The outer housing of RPN 120 is designed to provide a hermetically sealed environment to the interior of RPN 120. The hermetically sealed environment provided by the outer housing of RPN 120 helps protect internal components such as power supply 140 and RPD 160 from outdoor environmental factors, such as humidity, water, debris, and changes in pressure.

RPN 120 comprises an optical network transceiver (SFP), but embodiments may also be employed in contexts where access to other types of communication interface, such as a wireless network, instead of or in addition to the optical network, is available. In addition to data transmitted through the RPD 120 to and from cable subscribers, and in addition to communications required to fulfill the operation of the RPD Main Functions 162, Internal Computerized Component 164 of the RPD may send and receive data communications over the optical network (or over a wireless network in contexts where such a network is available). This advantageously allows an operator or technician to send and receive data to RPN 120 deployed in the field, such as for purposes of configuring the operation of RPN 120, providing additional or revised data or executable instructions to RPN 120, and/or receiving information about the imminent failure of power supply 140.

Power supply 140 inside RPN 120 also comprises a plurality of temperature sensors $144_1$ to $144_N$ dispersed over different locations of power supply 140. Such temperature sensors $144_1$ to $144_N$ and 146 may measure the temperature in the interior of power supply 140 at different locations. A portion of temperature sensors $144_1$ to $144_N$ are positioned such that the temperature of critical components may be measured, which shall be discussed below in greater detail in relation to FIG. 3. Certain temperature sensor(s) 146 should be able to measure or provide a sufficient estimation of the temperature of the ambient air inside power supply 140. Further, a portion of temperature sensors $144_1$ to $144_N$ should be positioned on components within power supply 140, such as each electrolytic capacitor which forms part of power supply 140, so that the temperature of those components may be directly measured.

Figure 3:
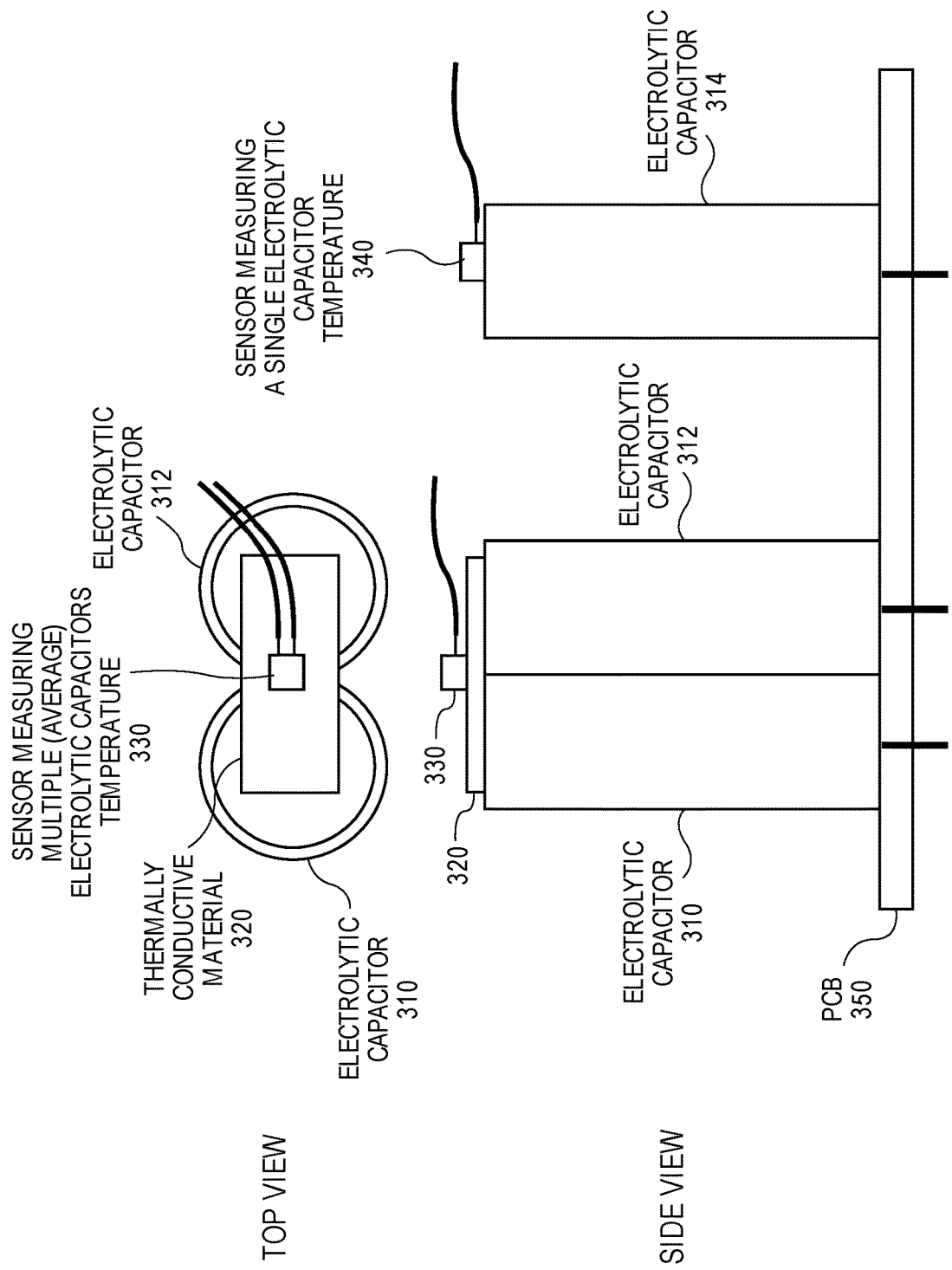
FIG. 3 is an illustration of exemplary temperature sensors disposed on electrolytic capacitors inside a power supply according to an embodiment of the invention.

FIG. 3 is an illustration of electrolytic capacitors inside a power supply, and exemplary temperature sensors disposed therein, according to an embodiment of the invention. Power supply 140 may be constructed using one or more electrolytic capacitors, with most power supplies comprising a plurality of electrolytic capacitors. For example, FIG. 3 depicts a side view of a power supply comprised of three electrolytic capacitors 310, 312 and 314, which their temperature is measured by two temperature sensors. Electrolytic capacitors 310 and 312 are also depicted in FIG. 3 using a top view to further describe the method by which a single temperature sensor can measure average temperature across a plurality of electrolytic capacitors. The lifespan of the power supply is largely dictated by the lifespan of the electrolytic capacitors used to construct the power supply.

An electrolytic capacitor is made using two different aluminum layers separated by liquid electrolyte material. The lifespan of an electrolytic capacitor may end when the liquid electrolyte material, included within the aluminum layers of the electrolytic capacitor, dries out and exsiccates. The rate of which the liquid electrolyte material dries out and exsiccates is affected by the long-term temperature experienced by the liquid electrolyte material. The long-term temperature experienced by the liquid electrolyte material corresponds to the external environmental temperature (i.e., the temperature at the location where RPN 120 is deployed) over time and the temperature rise of the electrolytic capacitor itself over time.

The temperature of an electrolytic capacitor may rise over time due to ripple current through the electrolytic capacitor's equivalent series resistance (ESR). As an electrolytic capacitor dries out and approaches the end of its lifespan, its ESR rises. The rising ESR of the electrolytic capacitor causes an increase in internal temperature due to the flow of current through the increased resistance. As a result, as an electrolytic capacitor nears the end of its lifespan, the electrolytic capacitor experiences an exponential acceleration of its rising temperature and ESR. Embodiments of the invention may employ these principles in estimating the lifespan of the power supply of a RPD.

FIG. 3 depicts a temperature sensor 330 disposed on a thermally conductive material 320 on electrolytic capacitors 310 and 312 inside a power supply. Use of thermally conductive material 320 is useful when thermally connecting two or more electrolytic capacitors, as temperature sensor 330 may measure the average temperature of both electrolytic capacitors 310 and 312. Use of thermally conductive material 320 is optional when both capacitors are expected to have similar behavior and lifespan, such as when they are identical and are connected in parallel. FIG. 3 also depicts a temperature sensor 340 disposed directly on an electrolytic capacitor 314. A power supply be coupled to, or disposed upon, a printed circuit board 350 or other electrical conductor or component for purposes of supply electrical power thereto. As shown in FIG. 2, RPN 120 also comprises Remote RHY device 220, which is a device which performs many of the functions involved in converting downstream DOCSIS data, MPEG video, and out-of-band (OOB) signals from digital to analog and upstream data, video, and OOB signals from analog to digital. These functions are depicted in FIG. 2 as being performed by RPD main functions 162. RPD 160 may also comprise internal computerized component 164, which is responsible for certain responsibilities discussed herein, such as obtaining measurements from temperature sensors $144_1$ to $144_N$, temperature sensor(s) 146, and voltage and current sensors 148. A non-limiting, illustrative example of Remote RHY device 220 is Harmonic, Inc.'s CableOS™ Pebble-1 Remote PHY device.

Figure 4:
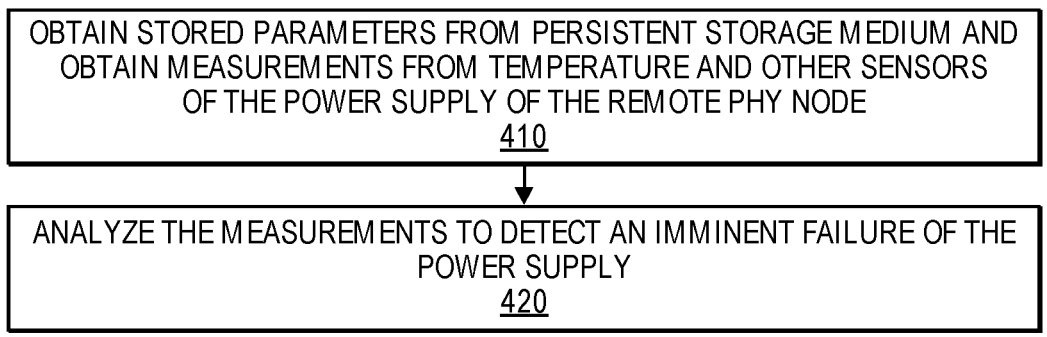
FIG. 4 is a flowchart illustrating the functional steps of detecting an imminent failure in a power supply according to an embodiment of the invention.

FIG. 4 is a flowchart illustrating the functional steps of detecting an imminent failure in a power supply of a Remote PHY node (RPD) 120 according to an embodiment of the invention. The steps of FIG. 4 may be used to ascertain when it is necessary to replace a power supply of RPN 120 prior to the imminent failure of the power supply. Embodiments may provide sufficient notice (for example, in the order of a few days) so that the power supply may be replaced prior to it failing, which may lead to loss of service and total failure of device powered by the power supply.

In step 410, critical parameters are retrieved from persistent storage medium 150 inside the power supply and a measurement is obtained from one or more temperature and other sensors $144_1$ to $144_N$, 146 and 148. Temperature sensors 146 should obtain temperature measurements of the ambient air within power supply 140. In addition, temperature sensors $144_1$ to $144_N$ should obtain a direct measurement of the temperature of the electrolytic capacitor within power supply 140. Furthermore, information stored in persistent storage medium 150 in power supply 140 is obtained by internal computerized component 164. Such information may include parameters required for power supply normal expected internal temperature rise and stress estimation specific to the power supply for which it is estimated, as well as historical expected internal temperature rise and stress calculations that were previously stored in the power supply.

In embodiments, measurements may be taken from temperature sensors $144_1$ to $144_N$ and 146 repeatedly at regular intervals of time. As a result, a running data set of the temperatures measured by temperature sensors $144_1$ to $144_N$ and 146 may be gathered. This running data set documents the absolute temperature and/or the temperature rise of components at various locations within the power supply. Other power supply measurements such as voltages and currents may also be taken using voltage and current sensors 148 to gather a running data set of the stress level experienced by the power supply.

In one embodiment, temporary measurements recorded by temperature sensors $144_1$ to $144_N$ and 146 and optionally by voltage and current sensors 148 in step 410 are temporarily stored, with the set of any previously obtained measurements, in internal computerized component 164, e.g., in a temporary storage medium for storing digital data, such that analysis in step 420 can be performed less frequently than the rate of obtaining the power supply sampled measurements. Such may be required in order to reduce the rate at which the result of the analysis is stored in a persistent storage medium 150 in order to reduce its wear.

In step 420, internal computerized component 164 analyzes the set of measurements obtained and/or stored therein, and the parameters retrieved from persistent storage medium 150 in step 410, to detect an imminent failure expected in a power supply. As the difference between the temperature of an electrolytic capacitor inside power supply 140 and the ambient air inside power supply 140, as scaled by the estimated current experienced on the electrolytic capacitor, exhibits an abnormal rise, this is an indication that the electrolytic capacitor equivalent series resistance (ESR) is rising, indicating an imminent failure of the electrolytic capacitor, power supply 164, and the entire remote PHY node 120. Internal computerized component 164 may record measurements made at regular intervals of the temperatures of each power supply. In an embodiment, the length of time between temperature measurements is based, at least in part, upon the fastest expected rate of temperature change governed by heat absorption (changes in sun loading due to cloud shading) and the thermal mass of RPD 160.

Recall that by comparing the temperature of the ambient air within RPD 160 and/or within the power supply 140 against the temperature of a particular electrolytic capacitor, the temperature rise of that particular electrolytic capacitor due to an increase in its ESR may be determined. The internal computerized component 164 may use this approach to identify whether the temperature of a particular electrolytic capacitor has exceeded some predetermined threshold as well as identify the rate of change of any increase in temperature of the particular electrolytic capacitor.

Embodiments of the invention may consider other factors or measurements as well in the performance of step 320. Certain embodiments may consider the amount of current flowing into or out of a particular power supply in identifying an imminent failure of a power supply 140 of RPD 160. Similarly, certain embodiments may consider the amount of voltage measured across a particular power supply 140 in identifying an imminent failure of a power supply 140 of RPD 160.

Note that the weighted set of factors used by internal computerized component 164 in identifying an imminent failure of a power supply of RPD 160 in step 420 may be updated or revised over time. An updated version of the weighted set of factors may be received at RPD 160 over a network via communication interface 170. Such an updated version may be sent by a technician or repairman. Internal computerized component 164 may then subsequently use the updated version of the weighted set of factors henceforth in identifying an imminent failure of power supply 140.

Certain embodiments may use a different weighted set of factors for different types of power supplies and/or different types of electrolytic capacitors. For example, assume that power supply 140 is a first type of a power supply, while another power supply (not depicted in FIG. 2) comprised within RPN 120 is a second type of power supply. In this example, an embodiment may use a first weighted set of factors to identifying an imminent failure in power supply 140, and may use a second weighted set of factors, different from the first set, in identifying an imminent failure in the other power supply of the second type. In one embodiment, the specific set of factors used in estimating the imminent pending failure of each power supply is stored in a persistent storage medium 150 in the power supply itself. In another embodiment, multiple sets of factors used in estimating the imminent pending failure of different power supplies are part of the parameters and algorithms provided to the internal computerized component 164 and stored in its own non-volatile memory. In such a case the internal computerized component 164 may use a power supply type identification obtained from the power supply to associate the correct set of parameters with the power supply and use them for estimating the imminent pending failure of that power supply.

After identifying that the internal temperature of a particular electrolytic capacitor is increasing abnormally, internal computerized component 164 may use a set of weighted factors, which may include the rate of temperature increase of the particular electrolytic capacitor and the difference between the ambient temperature within RPD 160 and the observed temperature of the particular electrolytic capacitor, internal computerized component 164 may estimate how much time remains before the particular electrolytic capacitor experiences a failure. It is anticipated that embodiments can provide at least several days notice before any failure of a power supply.

After internal computerized component 164 identifies that a particular power supply of RPD 160 will soon experience an imminent failure, internal computerized component 164 may issue an alarm or otherwise send electronic notification of such to a technician or monitoring center responsible for maintaining and overseeing the proper operation of RPD 160. In this way, a repairman may be sent to RPD 160 to replace power supply 140 prior to the failure of power supply 140, which would cause RPD 160 to experience total service failure.

Once a power supply of RPN 120 fails, considerable expense is involved in sending out a repairman in an expedited fashion to replace the power supply. Moreover, having service become unavailable is increasingly becoming an unacceptable; consequently, there are considerable financial incentives to ensure the service provided by RPN 120 remains uninterrupted. Embodiments of the invention advantageously provide advance knowledge or forewarning of the imminent failure of the power supply of RPN 120. Embodiments of the invention enable power supply replacements to be made on a scheduled basis ahead of failure so that rush service calls and service down time may be avoided.

Figure 5:
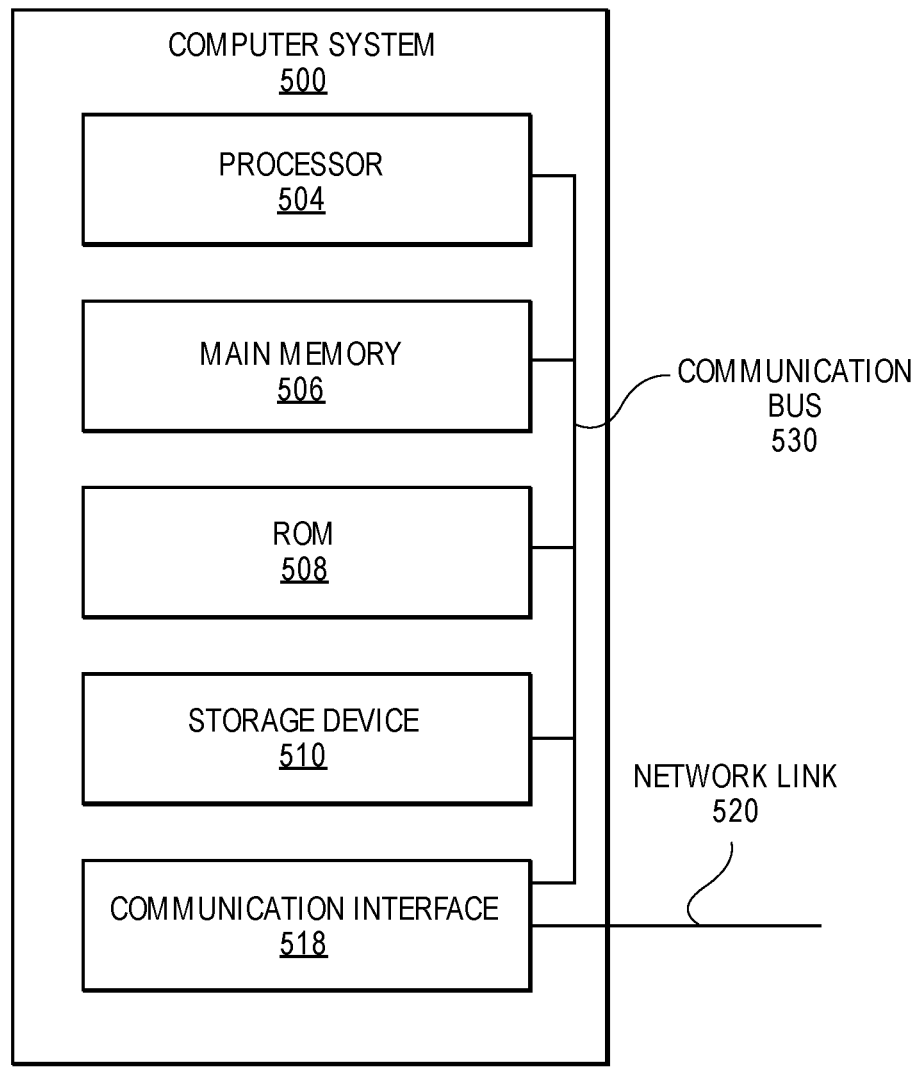
FIG. 5 is a block diagram that illustrates a computer system upon which an embodiment of the invention may be implemented.

FIG. 5 is a block diagram that illustrates a computer system 500, which may be used to implement internal computerized component 164 in an embodiment of the invention. In an embodiment, computer system 500 includes processor 504, main memory 506, ROM 508, storage device 510, communication interface 518, and communications bus 530. Computer system 500 includes at least one processor 504 for processing information. Computer system 500 also includes a main memory 506, such as a random access memory (RAM) or other dynamic storage device, for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device for storing static information and instructions for processor 504. A storage device 510, such as a magnetic disk or optical disk, is provided for storing information and instructions.

Embodiments of the invention are related to the use of computer system 500 for implementing the techniques described herein. According to one embodiment of the invention, those techniques are performed by computer system 500 in response to processor 50 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the process steps described herein. In alternative embodiments, hard-wired circuitry may be used in place of or in combination with software instructions to implement embodiments of the invention. Thus, embodiments of the invention are not limited to any specific combination of hardware circuitry and software.

The term "non-transitory machine-readable storage medium" as used herein refers to any tangible medium that participates in storing instructions which may be provided to processor 504 for execution. Non-limiting, illustrative examples of non-transitory machine-readable media include, for example, a floppy disk, a flexible disk, hard disk, magnetic tape, or any other magnetic medium, a CD-ROM, any other optical medium, a RAM, a PROM, and EPROM, a FLASH-EPROM, any other memory chip or cartridge, or any other medium from which a computer can read.

Various forms of non-transitory machine readable media may be involved in carrying one or more sequences of one or more instructions to processor 504 for execution. For example, the instructions may initially be carried on a magnetic disk of a remote computer. The remote computer can load the instructions into its dynamic memory and send the instructions over a network link 520 to computer system 500.

Communication interface 518 provides a two-way data communication coupling to a network link 520 that is connected to a local network. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links or optical links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through a network to one or more other computer systems.

Computer system 500 can send messages and receive data, including program code, through the network(s), network link 520 and communication interface 518. For example, a server might transmit a requested code for an application program through the Internet, a local ISP, a local network, subsequently to communication interface 518. The received code may be executed by processor 504 as it is received, and/or stored in storage device 510, or other non-volatile storage for later execution.

Communications 530 is a mechanism for enabling various components of computer system 500 to communicate with one another. In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A non-transitory computer-readable storage medium that stores one or more sequences of instructions for detecting an imminent failure in a power supply, which when executed by one or more processors, cause:
    an internal computerized component periodically reading a set of measurements from one or more sensors affixed to said power supply and storing at least a portion of the set of measurements read from said one or more sensors as a stored set of measurements; and
    the internal computerized component analyzing said set of measurements and said stored set of measurements using, at least in part, a weighted set of factors, to detect the imminent failure in said power supply based upon, at least in part, detecting an exponential acceleration of rising temperature and equivalent series resistance (ESR) in at least one electrolytic capacitor of said power supply,
    wherein said internal computerized component and said power supply are comprised within a Remote PHY node, a Remote MACPHY node (RMN), an Optical Line Terminal (OLT) node, or a 802.11n Wi-Fi Access Point.

2. The non-transitory computer-readable storage medium of claim 1, wherein execution of the one or more sequences of instructions further cause:
    the internal computerized component transmitting notification of the imminent failure of said power supply over a wireless network using a transceiver.

3. The non-transitory computer-readable storage medium of claim 1, wherein execution of the one or more sequences of instructions further cause:
    the internal computerized component transmitting notification of the imminent failure of said power supply over a network link to a software application that monitors the operation of the power supply.

4. The non-transitory computer-readable storage medium of claim 1, wherein said one or more sensors measure temperature of electrolytic capacitors comprised within said power supply.

5. The non-transitory computer-readable storage medium of claim 1, wherein execution of the one or more sequences further comprises:
  in response to receiving an updated version of said weighted set of factors over a wireless network, the internal computerized component storing said updated version of said weighted set of factors and subsequently using said updated version of said weighted set of factors to detect the imminent failure of the power supply.

6. The non-transitory computer-readable storage medium of claim 1, wherein the power supply is one of a plurality of power supplies, and wherein said plurality of power supplies includes two or more types of power supplies, and wherein said analyzing said set of measurements comprises:
  the internal computerized component analyzing said set of measurements using, at least in part, a first weighted set of factors, to detect the imminent failure of a first type of power supply; and
  the internal computerized component analyzing said set of measurements using, at least in part, a second weighted set of factors different from said first weighted set of factors, to detect the imminent failure of a second type of a power supply.

7. The non-transitory computer-readable storage medium of claim 1, wherein the weighted set of factors assesses an impact temperature has, over time, upon the equivalent series resistance (ESR) of the power supply.

8. The non-transitory computer-readable storage medium of claim 1, wherein the said one or more sensors include at least one sensor that measures ambient temperature, at least one sensor that measures temperature of a electrolytic capacitor of the power supply, at least one sensor that measure current from or to the power supply, and at least one sensor that measures voltage across the power supply.

9. The non-transitory computer-readable storage medium of claim 1, wherein the internal computerized component uses a previously calculated imminent failure estimation stored in said persistent storage medium in conjunction with new measurements to create an updated imminent failure estimation which is subsequently stored in the persistent storage medium for future analysis and use.

10. The non-transitory computer-readable storage medium of claim 1, wherein execution of the one or more sequences of instructions further cause:
  contemporaneous with the internal computerized component analyzing said set of measurements and said stored set of measurements to detect the imminent failure in said power supply, the internal computerized component determining an estimate of how much time remains before a particular electrolytic capacitor in said power supply experiences a failure.

11. The non-transitory computer-readable storage medium of claim 1, wherein said stored set of measurements are stored less frequently than said set of measurements are read from said set of one or more sensors.

12. A non-transitory computer-readable storage medium that stores one or more sequences of instructions for detecting an imminent failure in a power supply, which when executed by one or more processors, cause:
  an internal computerized component periodically reading a set of measurements from one or more sensors affixed to said power supply; and
  the internal computerized component analyzing said set of measurements using, at least in part, a weighted set of factors, to detect the imminent failure in said power supply,
  wherein the internal computerized component uses a previously calculated imminent failure estimation stored in said persistent storage medium in conjunction with new measurements to create an updated imminent failure estimation which is subsequently stored in the persistent storage medium for future analysis and use, and
  wherein the updated imminent failure estimation is maintained in volatile memory for two or more calculation cycles prior to persistently storing the updated imminent failure estimation on the persistent storage medium.

13. An apparatus for detecting an imminent failure in a power supply, comprising:
  one or more processors; and
  one or more non-transitory computer-readable storage mediums storing one or more sequences of instructions, which when executed, cause:
    an internal computerized component periodically reading a set of measurements from one or more sensors affixed to said power supply and storing at least a portion of the set of measurements read from said one or more sensors as a stored set of measurements; and
    the internal computerized component analyzing said set of measurements and said stored set of measurements using, at least in part, a weighted set of factors, to detect the imminent failure in said power supply based upon, at least in part, detecting an exponential acceleration of rising temperature and equivalent series resistance (ESR) in at least one electrolytic capacitor of said power supply,
    wherein said internal computerized component and said power supply are comprised within a Remote PHY node, a Remote MACPHY node (RMN), an Optical Line Terminal (OLT) node, or a 802.11n Wi-Fi Access Point.

14. The apparatus of claim 13, wherein execution of the one or more sequences of instructions further cause:
  the internal computerized component transmitting notification of the imminent failure of said power supply over a wireless network using a transceiver.

15. The apparatus of claim 13, wherein execution of the one or more sequences of instructions further cause:
  the internal computerized component transmitting notification of the imminent failure of said power supply over a network link to a software application that monitors the operation of the power supply.

16. The apparatus of claim 13, wherein said one or more sensors measure temperature of electrolytic capacitors comprised within said power supply.

17. The apparatus of claim 13, wherein execution of the one or more sequences further comprises:
  in response to receiving an updated version of said weighted set of factors over a wireless network, the internal computerized component storing said updated version of said weighted set of factors and subsequently using said updated version of said weighted set of factors to detect the imminent failure of the power supply.

18. The apparatus of claim 13, wherein the power supply is one of a plurality of power supplies, and wherein said plurality of power supplies includes two or more types of power supplies, and wherein said analyzing said set of measurements comprises:

the internal computerized component analyzing said set of measurements using, at least in part, a first weighted set of factors, to detect the imminent failure of a first type of power supply; and the internal computerized component analyzing said set of measurements using, at least in part, a second weighted set of factors different from said first weighted set of factors, to detect the imminent failure of a second type of a power supply.

19. The apparatus of claim 13, wherein the weighted set of factors assesses an impact temperature has, over time, upon the equivalent series resistance (ESR) of the power supply.

20. The apparatus of claim 13, wherein the said one or more sensors include at least one sensor that measures ambient temperature, at least one sensor that measures temperature of a electrolytic capacitor of the power supply, at least one sensor that measure current from or to the power supply, and at least one sensor that measures voltage across the power supply.

21. The apparatus of claim 13, wherein the internal computerized component uses a previously calculated imminent failure estimation stored in said persistent storage medium in conjunction with new measurements to create an updated imminent failure estimation which is subsequently stored in the persistent storage medium for future analysis and use.

22. A method for detecting an imminent failure in a power supply, comprising:

an internal computerized component periodically reading a set of measurements from one or more sensors affixed to said power supply and storing at least a portion of the set of measurements read from said one or more sensors as a stored set of measurements; and the internal computerized component analyzing said set of measurements and said stored set of measurements using, at least in part, a weighted set of factors, to detect the imminent failure in said power supply based upon, at least in part, detecting an exponential acceleration of rising temperature and equivalent series resistance (ESR) in at least one electrolytic capacitor of said power supply, wherein said internal computerized component and said power supply are comprised within a Remote PHY node, a Remote MACPHY node (RMN), an Optical Line Terminal (OLT) node, or a 802.11n Wi-Fi Access Point.

23. The apparatus of claim 13, wherein execution of the one or more sequences of instructions further cause:

contemporaneous with the internal computerized component analyzing said set of measurements and said stored set of measurements to detect the imminent failure in said power supply, the internal computerized component determining an estimate of how much time remains before a particular electrolytic capacitor in said power supply experiences a failure.

24. The apparatus of claim 13, wherein said stored set of measurements are stored less frequently than said set of measurements are read from said set of one or more sensors.

25. An apparatus for detecting an imminent failure in a power supply, comprising:

one or more processors; and one or more non-transitory computer-readable storage mediums storing one or more sequences of instructions, which when executed, cause:

an internal computerized component periodically reading a set of measurements from one or more sensors affixed to said power supply; and the internal computerized component analyzing said set of measurements using, at least in part, a weighted set of factors, to detect the imminent failure in said power supply, wherein the internal computerized component uses a previously calculated imminent failure estimation stored in said persistent storage medium in conjunction with new measurements to create an updated imminent failure estimation which is subsequently stored in the persistent storage medium for future analysis and use, wherein the updated imminent failure estimation is maintained in volatile memory for two or more calculation cycles prior to persistently storing the updated imminent failure estimation on the persistent storage medium.

* * * * *